United States Patent [19]

Jason et al.

[11] Patent Number: 4,962,317

[45] Date of Patent: Oct. 9, 1990

[54] CONFINED ENERGY DISTRIBUTION FOR CHARGED PARTICLE BEAMS

[75] Inventors: Andrew J. Jason; Barbara Blind, both of Los Alamos, N. Mex.

[73] Assignee: The United States of America as represented by the United States Department of Energy, Washington, D.C.

[21] Appl. No.: 414,232

[22] Filed: Sep. 29, 1989

[51] Int. Cl.[5] .............................................. H01J 37/141

[52] U.S. Cl. ......................... 250/396 ML; 250/396 R; 250/398

[58] Field of Search ........... 250/396 R, 396 ML, 398, 250/492.21; 313/361.1

[56] References Cited

U.S. PATENT DOCUMENTS

| | | | |
|---|---|---|---|
| 4,276,477 | 6/1981 | Enge | 250/492.21 |
| 4,468,587 | 8/1984 | Sluyterman | 313/413 |
| 4,486,644 | 12/1984 | Wollnik | 250/292 |
| 4,736,106 | 4/1988 | Kasky | 250/396 ML |
| 4,804,851 | 2/1989 | Nixon | 250/398 |
| 4,823,013 | 4/1989 | Van der Mast | 250/396 ML |
| 4,853,545 | 8/1989 | Rose | 250/396 ML |

OTHER PUBLICATIONS

E. Kashy et al., "A Method for the Uniform Charged Particle Irradiation of Large Targets", B26 Nucl. Instr. and Meth., pp. 610–613 (1987).

B. Sherrill et al., "Use of Multipole Magnetic Fields for Making Uniform Irradiations", B40/41 Nucl. Instr. and Meth., pp. 1004–1007 (1989).

*Primary Examiner*—Bruce C. Anderson
*Attorney, Agent, or Firm*—Ray G. Wilson; Paul D. Gaetjens; William R. Moser

[57] ABSTRACT

A charged particle beam is formed to a relatively larger area beam which is well-contained and has a beam area which relatively uniformly deposits energy over a beam target. Linear optics receive an accelerator beam and output a first beam with a first waist defined by a relatively small size in a first dimension normal to a second dimension. Nonlinear optics, such as an octupole magnet, are located about the first waist and output a second beam having a phase-space distribution which folds the beam edges along the second dimension toward the beam core to develop a well-contained beam and a relatively uniform particle intensity across the beam core. The beam may then be expanded along the second dimension to form the uniform ribbon beam at a selected distance from the nonlinear optics. Alternately, the beam may be passed through a second set of nonlinear optics to fold the beam edges in the first dimension. The beam may then be uniformly expanded along the first and second dimensions to form a well-contained, two-dimensional beam for illuminating a two-dimensional target with a relatively uniform energy deposition.

8 Claims, 6 Drawing Sheets

Beam at the target. Input distribution: Gaussian

Beam at the target. Input distribution: Parabolic

CONFINED ENERGY DISTRIBUTION FOR CHARGED PARTICLE BEAMS

This invention is the result of a contract with the Department of Energy (Contract No. W-7405-ENG-36).

BACKGROUND OF THE INVENTION

This invention relates to accelerator beam optics and, more particularly, to shaping charged particle beams for confining the beam energy distribution over a selected target area.

Charged particle beams contain particles which have been accelerated to high energies. The accelerated particles are directed onto target areas for a variety of purposes, e.g. medical treatments, X-ray generation, lithography, neutron spallation, tritium production, food sterilization, etc. In some applications a target area large compared to an original beam must be illuminated by the beam, where confinement of the beam energy and/or the uniformity of illumination, i.e., energy deposition, on the target area are important.

For example, in the production of tritium, an intense linear accelerator (linac) produces a proton beam (i.e., 400 mA at 2 GeV or about a gigawatt of continuous power) which is incident on a target composed of lead to generate neutrons which, in turn, strike lithium for tritium production. A beam target area of 4 m by 4 m may be required to be covered by a beam having only millimeter dimensions at the linac.

A simple beam expansion by conventional linear magnetic optics is not appropriate. The Gaussian-like intensity distribution of particles in the beam would conventionally provide a sharply peaked beam at the target with an appreciable peak intensity at several times the beam rms radius. Further, large amounts of the beam energy are contained in the beam fringes which would not be available over the target area if the beam is to provide any substantial energy deposition on the target edges. Another approach would be to raster the beam over the target area. If a typical beam is expanded to a diameter of several centimeters and rastered over the above 16 $m^2$ surface area in a two-dimensional scan, thermal considerations dictate a minimum scanning frequency of about 1 Hz in the slower scan direction and about 10 Hz in a direction normal to the slower scan direction. Moreover, large magnets with very large apertures would be needed and the peak reactive EMF's would be large. Additionally, the magnets would need to be energized with several harmonics or provided with high power swithing devices to maintain a uniform target illumination.

It would be desirable to form the beam where the beam energy is confined over a large area and with a core beam area of relatively uniform charged particle intensity for uniform energy deposition on a target area. This problem is addressed by the present invention wherein confined particle beams define relatively uniform beam intensity distributions as large area beams or ribbon beams for impacting a target area.

Accordingly, it is one object of the present invention to form a charged particle beam having a nonuniform, peaked particle distribution, e.g., a Gaussian or parabolic distribution, into a particle beam having a confined energy distribution in at least one dimension.

It is another object of the present invention to form a charged particle beam to a configuration for relatively uniform energy deposition in at least one dimension over a target area.

One other object of the present invention is to use nonlinear magnetic optical elements to form a well contained charged particle beam having a relatively uniform particle distribution within beam edge portions.

Additional objects, advantages and novel features of the invention will be set forth in part in the description which folows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF INVENTION

To achieve the foregoing and other objects, and in accordance with the purposes of the present invention, as embodied and broadly described herein, the apparatus of this invention may comprise an optical system for manipulating a charged particle beam from a linear accelerator to form a uniform intensity beam for impacting a target. First linear optics receive an output beam from the accelerator and output a first beam having a first dimension which is small relative to a second dimension normal to the first dimension. Nonlinear optics are located about a small beam dimension, a beam waist, defined by the first dimension of the first beam. The nonlinear optics affect the first beam to output a second beam having a phase-space distribution effective to fold edge portions along the second dimension of the second beam toward a core region of the second beam wherein a well-contained beam is developed with an area of relatively uniform intensity along the second dimension at a determinable distance from the first nonlinear optics.

In another characterization of the present invention, a method is provided for forming a beam of charged particles from a linear accelerator into a beam having a well-contained beam with an area of relatively uniform intensity along at least one beam dimension. The accelerator beam is focused into a first beam having a small size in a first dimension relative to a second dimension normal to the first dimension. A nonlinear magnetic field is formed about a waist defined by the small first dimension effective to distort the phase-space distribution of the particles in a manner effective to fold edge portions of the beam along the second dimension toward a core region of the beam. Particle movements in the effected beam will result in a second beam being well-contained and developed with a realtively uniform intensity beam core along the second dimension at a determinable distance from the relatively small size beam portion.

In a particular embodiment of the present invention, the beam is transported through additional linear optics to form a beam which is ribbon-shaped in the second dimension for sweeping over a target area. In another embodiment, a second set of nonlinear optics affects the beam in the first dimension for folding edge portions along the first dimension toward the beam core region. A well-contained beam with a relatively uniform beam core intensity is then also developed along the first beam dimension. Linear optics focus the beam along both the first and second dimensions for illuminating a target area with a relatively uniform energy deposition.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Figure 1:
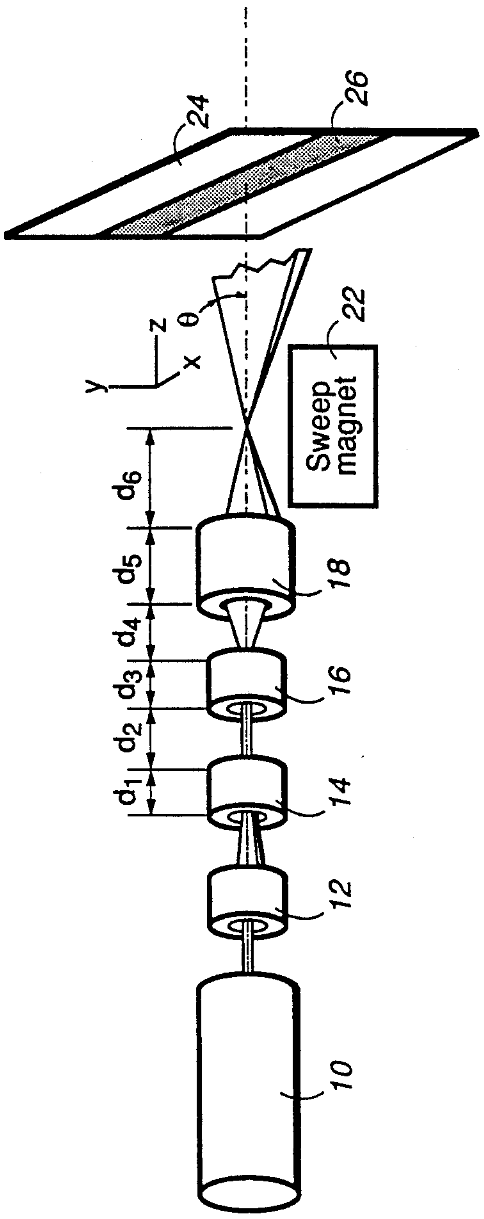
FIG. 1 is a schematic illustration of an optics system according to one embodiment of the present invention for forming a well-confined ribbon beam.

Referring first to FIG. 1, there is shown a schematic illustration of one embodiment of an accelerator beam-forming system according to the present invention. Linac 10 generates a particle beam for input to first focusing magnets 12, which may be one or more quadrupoles, for converging the beam in one dimension to a small size, which may be characterized by a waist, along the path of the beam. As used herein, the term "waist" means a beam section having a reduced dimension in one or more directions and is not identical with an optical waist. The beam is formed to have a first dimension much smaller than a second dimension normal to the first dimension and has a divergence suitable for subsequent beam forming as hereinafter explained. The beam will be relatively unaffected in the small dimension by nonlinear optics 14. For example, the rms beam width, $\sigma$, may be $<1$ mm in the first dimension and $>4$ cm in the second dimension.

Nonlinear optics 14 are located about the position of the small dimension or beam waist defined by the first dimension and produce a magnetic field which generates forces on the charged particles in the beam along the relatively wide second dimension. The forces vary nonlinearly from the beam axis, as hereinafter explained. The beam particles along the beam first dimension, i.e., the small dimension, are not subjected to these nonlinear forces. The effect of the nonlinear forces is to fold the beam fringe particles toward the beam core whereby a well-contained beam is formed, i.e., substantially all of the particles within at least $3\sigma$ of the beam centerline are within the effected dimension. A relatively uniform energy intensity distribution is obtained within a core region of the beam after a determinable beam drift distance from optics 14 concomitant with the beam containment. The beam intensity distribution within the contained core edges is relatively more uniform than the intensity in a conventional beam with a Gaussian or parabolic particle distribution, or some intermediate distribution. The resulting beam configuration obtains a relatively uniform intensity distribution across the core region along the second dimension and the beam is well-contained within beam edge portions.

In one embodiment, a ribbon beam is formed for sweeping across a target area. Focusing quadrupoles 16 and 18 may be provided as conventional focusing optics to form a beam impact area 26 on target 24 at a distance from optics 14 where a ribbon beam is formed having a relatively uniform particle intensity along the length of the ribbon. Quadrupole 16 may be a defocusing quadrupole to reduce the drift space between nonlinear optics 14 and focusing quadrupole 18. Focusing quadrupole 18 then focuses the beam to define a beam waist in the second dimension for positioning sweep magnet 22. Sweep magnet 22 conventionally generates a magnetic field to cause the particle beam to sweep the ribbon area 26 over the area of target 24, i.e., in a direction normal to the second dimension.

Figure 2:
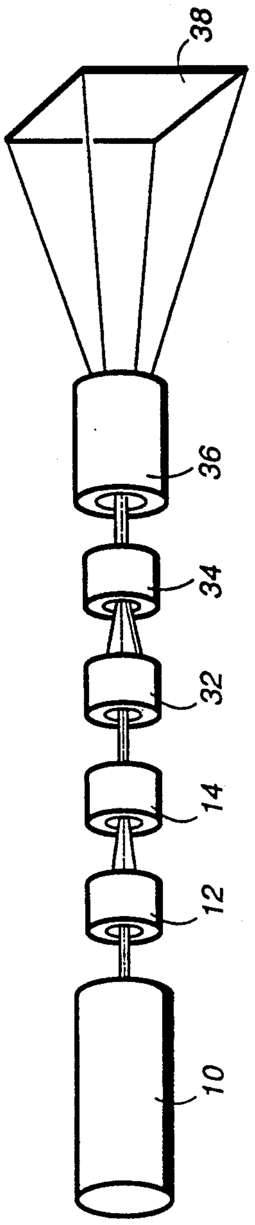
FIG. 2 is a schematic illustration of an optics system according to another embodiment of the present invention for forming a well-confined, large area two-dimensional beam.

Referring now to FIG. 2, the magnet optical elements generate a two-dimensional beam with a well-contained beam having a concomitant relatively uniform energy deposition over the entire target area illuminated by the beam. As discussed for FIG. 1, linac 10 generates a particle beam which is shaped by linear optics 12 to provide a small beam size defining a waist in a first dimension adjacent nonlinear optics 14 to isolate the effects of the nonlinear optics along the first and second dimensions. The magnetic field generated by optics 14 forms the input beam to a first output beam with a phase-space particle distribution effective to form a well contained beam with an area of relatively uniform intensity across the core region of the beam in a second beam dimension normal to the first beam dimension, as discussed above. The relatively uniform beam intensity will be developed at a predetermined distance from the beam waist affected by nonlinear optics 14.

First output beam 14 is then input to second linear optics 32, which may be a quadrupole, for further focusing the first beam in the second dimension. A second beam is outputted from linear optics 32 having a small size, i.e., a second waist, defined by the second dimension adjacent second nonlinear optics 34, whereby the second beam dimension is now small relative to the first beam dimension. Nonlinear optics 34 provides a magnetic field to fold the second beam along the relatively large first dimension to produce a third output beam developing a well-contained beam with a concomitant relatively uniform beam intensity across the core region of the beam in the first dimension at the same location as the folded first output beam.

The third output beam thus has a two-dimensional energy distribution which is well-contained and which will form a two-dimensional beam having a core region with a relatively uniform two-dimensional energy distribution at the predetermined transport distance from first nonlinear optics 14. Linear optics 36 focuses the third beam onto target area 38 to illuminate the entire area of target 38 with the area of the third output beam developed to a relatively uniform intensity. It should be noted that the edge portions of the third beam may be peaked relative to the core region. The edge portions may then be expanded beyond the edges of target 38 or may be intercepted prior to target 38 such that only the desired core region of the third beam illuminates target 38. Indeed, the core region of the third beam is defined to be the area contained within the edge peaks.

To understand the effect of nonlinear optics 14, 34 consider an input beam focused to a small size, i.e., a waist, in the y-direction. If optics 14, 34 are octupole magnets placed about the waist, particle motion from the magnetic forces in the octupole is governed by the following equations:

$$x'' = (B_o/r_o^3B_p)(x^3 - 3xy^2) \qquad (1)$$
$$y'' = (B_o/r_o^3B_p)(y^3 - 3x^2y)$$

where $B_o$ is the octupole pole-tip field;

$r_o$ is the pole-tip radius;

$B_p$ is the beam rigidity;

$x''$ and $y''$ are the second derivatives of the x and y coordinates with respect to the z coordinate.

Under the constraint that the beam is focused to be small in the y-direction during its passage through the octupole, the terms in Equation (1) that contain powers of y can be neglected. Integrating Equation (1) over a short octupole of length 1 defines the effect on particle divergence as $$\delta x' = T_{2,111}x^3 + O(y, 1, \ldots) = (B_o l/r_o^3Bp)x^3 + \qquad (2)$$

$T_{2,111}$ is the third order octupole matrix element relating $x'$ to $x^3$. Although there are 40 such elements, all but $T_{2,111}$ are coefficients of powers of y or are of the order $l^2$ or smaller. The beam is substantially unaffected in the y-direction because of the small y dimension at the octupole. The effect in the x-direction is given by Equation (2).

Figures 3A, 3B, 4A, 4B:
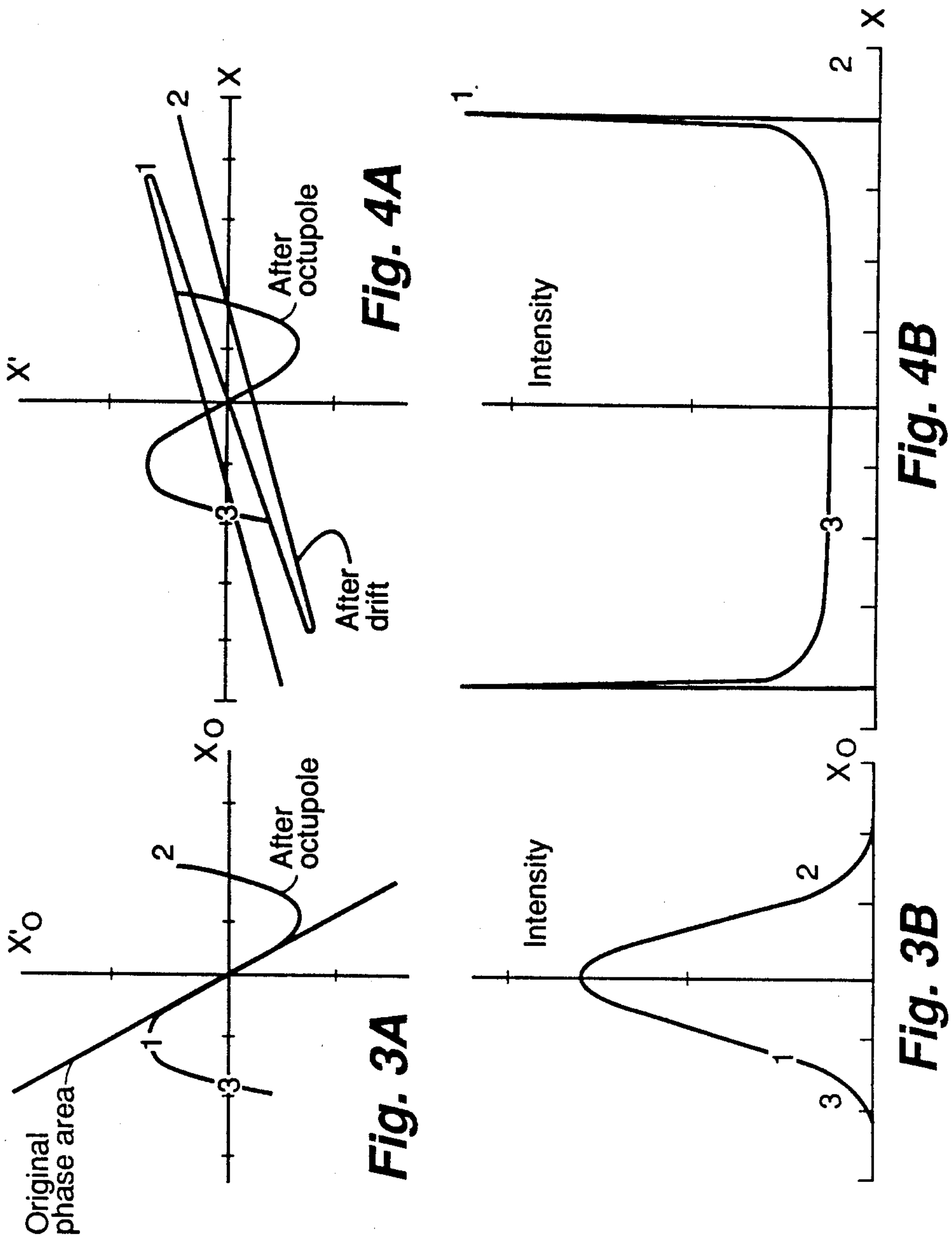
FIGS. 3A and 3B graphically illustrate the idealized phase-space distribution and Gaussian intensity distribution of a representative accelerator beam.
FIGS. 4A and 4B graphically illustrate the phase-space distribution and intensity distribution of a representative particle beam affected by nonlinear optics.

FIGS. 3A and 4A graphically depict the phase-space of the beam before the octupole, after the octupole, and after some drift distance from the octupole. FIGS. 3B and 4B are corresponding intensity distributions in the beam showing the evolution from a Gaussian distribution to a uniform ribbon distribution. After passage through the octupole, the beam phase-space axis will be approximately described by the relation $$x_o' = Ax_o + Bx_o^3, \qquad (3)$$

where A describes the tilt of the beam phase-space axis before the octupole (e.g. a negative number if the beam is converging in the x-direction) and B is the coefficient of $x^3$ in Equation (3) dependent on the octupole strength. FIG. 3A shows the original linear phase-space relationship and the relationship after the beam has been affected by the octupole. FIG. 3B shows the original Gaussian intensity distribution. Particles 1, 2, and 3 have phase and beam location characteristics identified on the graphs to aid in following the evolution of the Gaussian distribution through the transport line from the octupole to the beam.

Neglecting space charge effects, the relations describing particle evolution through a drift space L are $$x = x_o + x_o'L \qquad (4)$$
$$x' = x'_o$$

and define the evolution of each point on the beam phase-space distribution.

The influence of the octupole does not immediately change the beam distribution in the x-direction. However, the phase-space distribution and subsequent evolution is strongly altered. For example, particle 3, having zero divergence remains fixed along the x-axis; particle 1 is at a divergence extremum and progresses toward positive values of x. After some drift, particle 1 crosses the z-axis; after further drift the relationship shown in FIG. 4A obtains. The beam has expanded in proportion to the drift length. In the present example, particle 1 has diverged to a radius nearly four times its original radius (see FIG. 3A) and has nearly overtaken particle 2, which was originally at the $3\sigma$ extreme in the Gaussian distribution. Hence, the core of the beam has enveloped and contained the fringes of the beam.

The intensity distribution of the beam along the x-dimension is shown in FIG. 4B, where a well-contained beam has evolved having a relatively uniform beam along one dimension, excluding only the beam edges. The distribution shown in FIG. 4B was obtained by dividing the original distribution into small intervals, mapping each interval into its downstream phase-space coordinates by Equation (4) while conserving the probability for each interval, and then summing over the branches evident in the beam phase-space distribution.

The intensity distribution of FIG. 4B is relatively flat except at the edges where the fold in beam phase-space is projected onto the spatial axis as cusps. With further drift, particle 1 would overtake particle 2 and incorporate all the beam lying within more than $3\sigma$ of the original distribution into the core, leaving less than 0.3% of the beam in a widely scattered halo. It is possible to capture the fringes to approximately $5\sigma$ (0.001% fringe population) by adding nonlinear elements with higher odd multipolarities. For example, the addition of a properly dimensioned duodecapole (field variation of $x^5$), of opposite sign to the octupole, significantly decreases the value of $x_o'$ for parts of the beam beyond $3\sigma$. Hence, the region in FIG. 3A for which particle divergences are less in magnitude than $x'$ extremum would be expanded along with the concomitant capture region.

To further simulate the formation of a well-contained, uniform intensity ribbon beam according to the present invention, a set of performance characteristics was calculated for the nonlinear optics 14 and focusing quadrupoles 16 and 18 shown in FIG. 1. A low emittance linac beam (i.e., $0.003\pi$ cm mrad) was expanded by a quadruplet-lens configuration to $\sigma = 4$ cm in the x-direction and $\sigma = 1$ mm in the y-direction. The rms x-divergence was 17 mrad, and the beam was slightly convergent in y at 0.1 mrad. It should be noted that the final results were virtually insensitive to the initial emittance. A third order code MARYLIE (D. R. Douglas et al., "A Program for Nonlinear Analysis of Accelerator and Beamline Lattices," IEEE Trans. Nucl. Sci. 32 (5), pg. 2311 (1985)) was used to generate the optical characteristics given in Table A for the transport line magnets used to produce a beam with an x-waist downstream of quadrupole 18 and a divergence for the beam extrema in $x'$ (particle 1 in FIGS. 3A and 4A) of angle $r = 12°$. At 10 m from the waist, the beam core has expanded to an x-dimension of 4 m to extend across a target.

TABLE A

| | Octupole 14 | Quad 16 | Quad 18 |
|---|---|---|---|
| Length (m) | $d_1 = 1.5$ | $d_3 = 1.5$ | $d_5 = 2.5$ |
| Strength | 185 T/m$^3$ | 3.0 T/m | 4.25 T/m |
| Pole-tip radius (m) | 0.2 | 0.4 | 0.4 |

TABLE A-continued

| | Octupole 14 | Quad 16 | Quad 18 |
|---|---|---|---|
| Pole-tip field (T) | 1.5 | 1.2 | 1.7 |

The drifts between magnets are $d_2=1.5$ m, $d_4=1.0$ m, and $d_6=0.5$ m. The beam is focused to provide the desired divergence at the end of $d_6$. The performance characteristics shown in FIGS. 3A, 3B, 4A, and 4B were confirmed by the MARYLIE code.

Figure 5A:
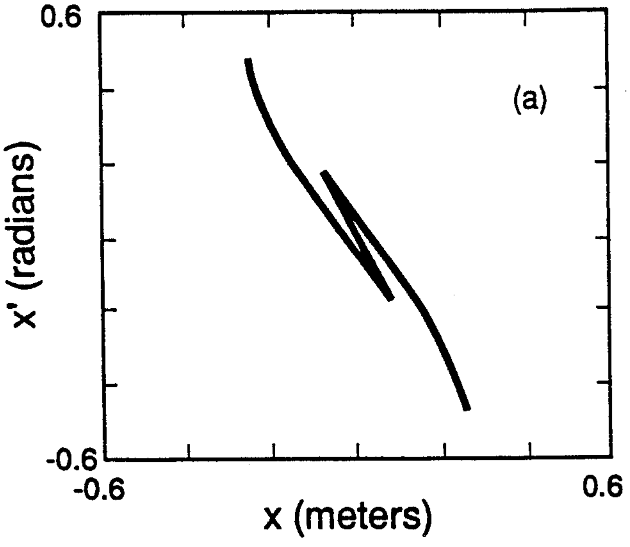
FIGS. 5A and 5B graphically illustrate the containment effect of including a duodecapole with an octupole to form the nonlinear optics.
Figure 5B:
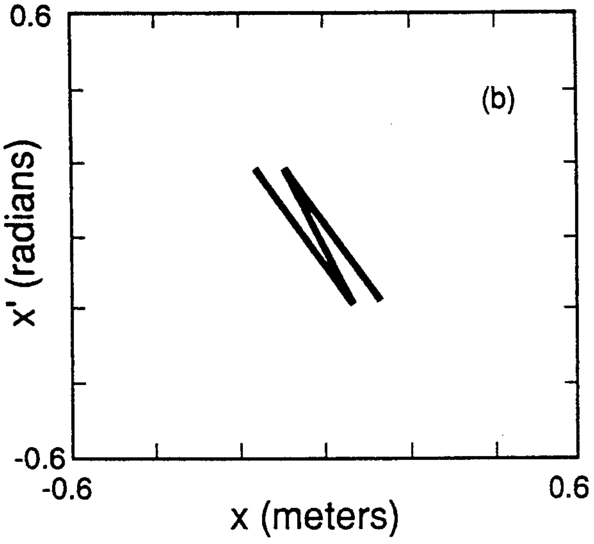

To determine the effect of including a duodecapole with the octupole in nonlinear optics 14 for the system discussed above, the beam phase-space was determined at the exit of quad 18 for an initial Gaussian-distributed beam including particles up to 5$\sigma$ from the beam axis. FIG. 5A depicts the phase-space distribution obtained with a pure octupole and indicates that there are a number of fringe particles not captured by the core. The effect of combining a duodecapole of strength −1500 T/m$^5$ with the octupole is shown in FIG. 5B; all particles within 5$\sigma$ in the initial distribution were captured.

Figure 6A:
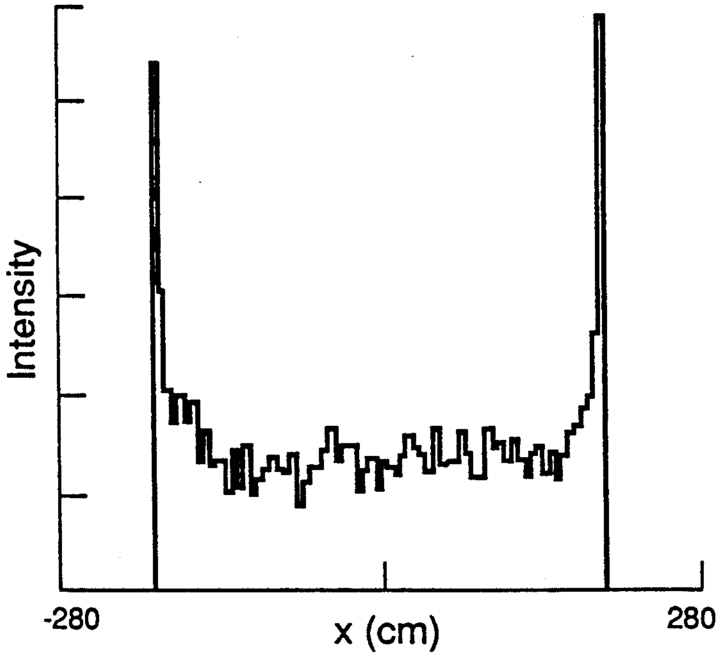
FIGS. 6A and 6B graphically depict the results of a ribbon beam simulation including space charge effects.
Figure 6B:
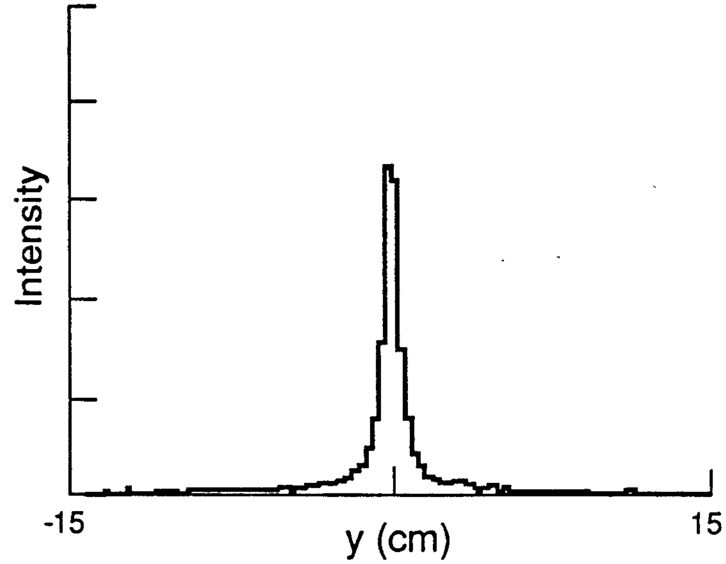
Figure 7A:
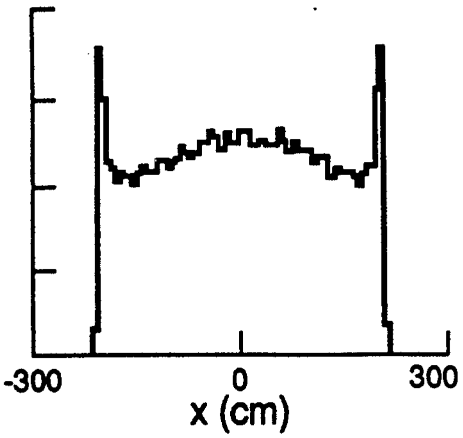
FIGS. 7A and 7B grphically depict the simulated two-dimensional beam intensity of a large area beam with a Gaussian input beam distribution.
Figure 7B:
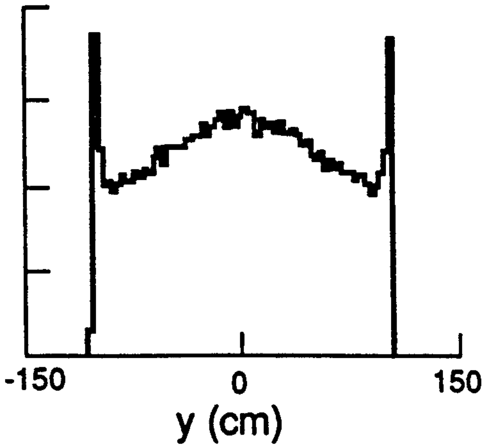
Figure 8A:
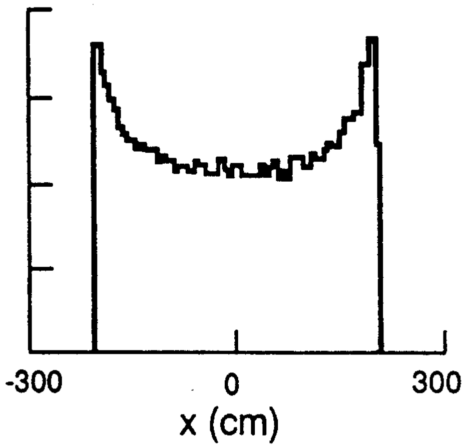
FIGS. 8A and 8B graphically depict the simulated two-dimensional beam intensity of a large area beam with a parabolic input beam distribution.
Figure 8B:
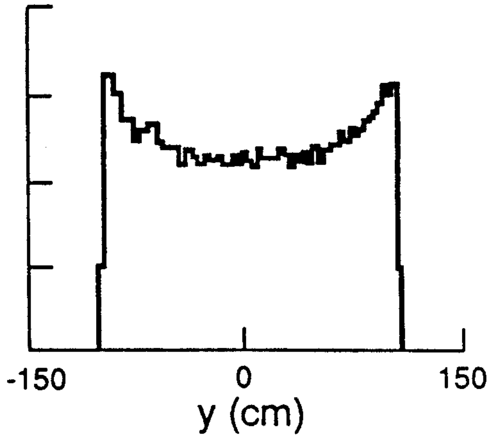

To further simulate an operating beam system, the above system was simulated with the addition of space charge and the beam evolution was determined with the particle-tracking code PATH (J. A. Farrell, "PATH-A Lumped Element Beam Transport Simulation Program with Space Charge," Proc. of Berlin Conf. on computing in Accel. Design and Operation, W. Busse and R. Zelany, Ed., Springer Verlag, Berlin pg. 267 (1984)). The phase-space and intensity distributions are shown in FIGS. 6A and 6B, respectively, and confirm that a relatively uniform beam can be achieved within the well-contained beam edges. The results are relatively insensitive to beam current; only small distribution changes were observed over a current range of 400 mA to 3 A.

Thus, a well-contained and relatively uniform intensity ribbon beam can be produced with the present system. Using only an octupole, up to 3$\sigma$ of the beam width will be folded into the core. Up to 5$\sigma$ of the beam width will be contained if a duodecapole is further included. The cusps at the beam extremes may contain several percent of the beam particles and will cause additional heating at the target edges unless they are removed prior to the target. The energy may also be effectively used by extending the target material to the side walls of the target vessel and allowing the beam to graze the walls. It will also be appreciated that beam distributions other than Gaussian, e.g., parabolic, can also be successfully folded using the above approach.

The nonlinear optics act on all beam distributions to direct the fringe particles toward the core region such that a well-contained and relatively uniform beam can be expected after appropriate linear transport following the nonlinear optics. Further, the degree of beam uniformity and the intensity of the beam edges, i.e., the cusps, can be adjusted to a particular application. If beam uniformity is not of paramount importance, the cusp intensity can be reduced. Likewise, the core intensity uniformity may be improved by adjusting the strength of nonlinear optics 14, 34, with a concomitant change in the cusp intensity.

FIGS. 7A, 7B, 8A, and 8B are simulation outputs from the PATH code showing the two dimensional beam distribution produced by a system as schematically illustrated in FIG. 2, with both Gaussian and parabolic accelerator beam distributions, respectively. The simulated target area was 4 m by 2 m. The simulated beam line characteristics are set out on Table B. The pole tip fields of all the magnets were kept at or below 1.5 T.

TABLE B

| Element | length(m) | $r_o$(m) | B$\rho$(T) |
|---|---|---|---|
| First octupole (14) | 0.50 | 0.020 | 0.768 |
| drift length | 6.50 | | |
| Focusing quadrupole (32) | 0.50 | 0.100 | 0.715 |
| drift length | 2.19 | | |
| Second octupole (34) | 1.00 | 0.134 | 0.914 |
| drift length | 15.50 | | |
| Defocusing quadrupole (36) | 1.500 | 2.00 | 0.356 |
| drift length | 10.50 | | |

As illustrated, the beams are substantially well-contained within a 4.8 m by 2.4 m area with a high degree of beam uniformity on the target area. The desired target area is well within the contained area such that the target is illuminated by the beam core region having the relatively uniform energy distributions that are desired over the target area. With octupole/duodecapole magnets, up to 7$\sigma$ of the beam is contained within the 4.8 m by 2.4 m edges. It will be appreciated that the degree of beam intensity uniformity will be affected by the exact accelerator beam distribution profile. However, the strength of the nonlinear magnetic fields can be further adjusted to optimize the energy distribution uniformity for a given initial beam distribution.

The foregoing description of the preferred embodiments of the invention has been presented for purposes of illustration and description. It is not intended to be exhaustive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Optics for manipulating a charged particle beam from a linear accelerator in at least one dimension for impacting a target, comprising:

first linear optics for inputting said beam and outputting a first beam forming a beam waist in a first dimension which is small relative to a second dimension normal to said first dimension, first nonlinear optics for receiving said first beam at about said first beam waist and outputting a second beam having a phase-space distribution effective to fold edge portions of said beam along said second dimension toward a core region of said beam wherein said beam is well-contained with an area of relatively uniform intensity along said second dimension at a determinable distance from said first nonlinear optics;

second linear optics for inputting said second beam and outputting a third beam defining a second beam waist along said second dimension which is small relative to said first dimension, and second nonlinear optics for receiving said third beam at about said second beam waist and outputting a fourth beam having a phase space distribution effective to fold edge portions of said beam along said first dimension toward a core region of said beam wherein said beam is well-contained in both said first and second dimensions at said determinable distance.

2. Optics according to claim 1, wherein said first nonlinear optics is an octupole.

3. Optics according to claim 2, wherein said nonlinear optics further includes a duodecapole.

4. Optics according to claims 1, 2, or 3, further including third linear optics for conforming said first and second dimensions to said target at said determinable distance.

5. A method for forming a well-contained beam of charged particles from a linear accelerator, comprising the steps of:

linearly focusing said accelerator beam into a first beam to form a first beam waist having a relatively small size in a first dimension normal to a second dimension;

forming a first nonlinear magnetic field about said first beam waist to distort the phase-space distribution of said particles in a manner effective to fold edge portions of said beam along said second dimension toward a core region of said beam to form a second beam wherein said beam is well-contained with an area of relatively uniform intensity developed along said second dimension at a determinable distance from said first wasit;

linearly focusing said second beam into a third beam to form a second beam waist with said second dimension small relative to said first dimension, and forming a second nonlinear magnetic field about said third beam at about said second waist to distort the phase-space distribution of said particles in a manner effective to fold edge portions of said third beam along said first dimension toward a core region of said third beam to form a well-contained fourth beam across said first dimension at said determinable distance.

6. A method according to claim 5, wherein the step of forming said first and second nonlinear magnetic fields includes placing octupole magnets about said first and second beam waists.

7. A method according to claim 5, wherein the step of forming said first and second nonlinear magnetic fields includes placing octupole magnets in combination with duodecapole magnets about said first and second beam waists.

8. A method according to claims 5, 6, or 7, further including the step of linearly focusing said first and second beam dimensions to cover a predetermined target area with said relatively uniform intensity beam at said determinable distance.

* * * * *